United States Patent
Yan et al.

(10) Patent No.: US 9,627,959 B2
(45) Date of Patent: Apr. 18, 2017

(54) SWITCH POWER CONVERTER AND FREQUENCY RESPONSE CHARACTERISTIC TESTING AND ADJUSTING METHOD THEREOF

(71) Applicant: DELTA ELECTRONICS (SHANGHAI) CO., LTD., Shanghai (CN)

(72) Inventors: Chao Yan, Shanghai (CN); Yanfeng Chen, Shanghai (CN); Zhihui Ding, Shanghai (CN)

(73) Assignee: DELTA ELECTRONICS (SHANGHAI) CO., LTD. (CN)

( * ) Notice: Subject to any disclaimer, the term of this patent is extended or adjusted under 35 U.S.C. 154(b) by 71 days.

(21) Appl. No.: 14/607,552

(22) Filed: Jan. 28, 2015

(65) Prior Publication Data
US 2015/0288277 A1 Oct. 8, 2015

(30) Foreign Application Priority Data
Apr. 3, 2014 (CN) .......................... 2014 1 0133523

(51) Int. Cl.
*H02M 3/04* (2006.01)
*G01R 31/40* (2014.01)
(Continued)

(52) U.S. Cl.
CPC .............. *H02M 3/04* (2013.01); *G01R 31/40* (2013.01); *H02M 3/08* (2013.01); *H02M 3/156* (2013.01); *H02M 2001/0025* (2013.01)

(58) Field of Classification Search
CPC .... H02M 3/156; H02M 3/158; H02M 3/1588; H02M 2003/1566; H02M 3/155;
(Continued)

(56) References Cited

U.S. PATENT DOCUMENTS

2008/0054869 A1* 3/2008 Chang ................... H02M 3/157
323/283
2009/0153083 A1 6/2009 Rozman et al.
(Continued)

FOREIGN PATENT DOCUMENTS

TW 200814499 3/2008

*Primary Examiner* — Jue Zhang
*Assistant Examiner* — Lakaisha Jackson
(74) *Attorney, Agent, or Firm* — Hauptman Ham, LLP

(57) ABSTRACT

A switch power converter and method of testing and adjusting is provided. A switch power unit comprises at least a power switch for transform of the power. A controller is configured to generate a control signal for the power switch. A detector is configured to detect an output voltage signal and/or an output current signal of the switch power unit and output a sampling signal. A testing and adjusting unit is configured to receive the sampling signal and output a testing signal to the controller. The testing and adjusting unit comprises a compensator. The compensator attends the testing and adjusting of the switch power converter. An AC disturbing signal various in frequency causes the difference in the sampling signal and the testing signal so as to test open-loop transfer function of the switch power converter, the compensator compensates frequency response characteristic of the switch power converter, when the frequency response characteristic of the switch power converter doesn't match a target frequency response characteristic.

15 Claims, 13 Drawing Sheets

(51) Int. Cl.
*H02M 3/08* (2006.01)
*H02M 3/156* (2006.01)
*H02M 1/00* (2006.01)

(58) Field of Classification Search
CPC ......... H02M 3/157; H02M 2001/0012; H02M 2001/0009
See application file for complete search history.

(56) References Cited

U.S. PATENT DOCUMENTS

| | | | |
|---|---|---|---|
| 2010/0176779 A1* | 7/2010 | Koyama | H02M 3/158 323/282 |
| 2010/0207594 A1* | 8/2010 | Davoudi | H02M 3/157 323/283 |
| 2013/0063102 A1* | 3/2013 | Chen | H02M 3/156 323/234 |
| 2014/0063873 A1* | 3/2014 | Acker | H02M 7/04 363/40 |

\* cited by examiner

SWITCH POWER CONVERTER AND FREQUENCY RESPONSE CHARACTERISTIC TESTING AND ADJUSTING METHOD THEREOF

BACKGROUND OF THE INVENTION

1. Field of the Invention

The present invention relates to the technology field of power converters, and more particularly to a switch power converter and a frequency response characteristic testing and adjusting method for the switch power converter.

2. Description of the Prior Art

Power converters, for example, the switching power converters, are broadly applied in the power systems of all kinds of industrial electrical equipment. For keeping the accuracy and stability of the power system, engineers need to accomplish the small-signal model analysis and the frequency response characteristic test of the power converter in the power system, so as to modulate and/or compensate the frequency response characteristic of the power converter for making the whole power system be able to operate reliably under a stable working range.

Please refer to FIG. 1, which illustrate a schematic connection diagram of a frequency response analyzer and a power system. As FIG. 1 shows, the frequency response analyzer 13' is connected to a power converter 11' and a controller 12' of a power system for testing the frequency response characteristic of the power converter 11'. After the frequency response analyzer 13' outputs a disturbance signal CH1' to the controller 12', the controller 12' outputs a control signal x' including the disturbance signal CH1' to the power converter 11', and then the power converter 11' outputs a stable output signal y' correspondingly.

Because CH2' is a voltage division signal of the stable output signal y', the frequency response characteristic of y/x can be determined by way of inputting the disturbance signal CH1' with a specific input range and then respectively measuring each of the control signals x' and the stable output signals y' under each of input frequencies. Therefore, the amplitude-frequency characteristic of the power converter 11' represented by the amplitude-ratio variation depending upon the frequency change of the stable output signals y' and the control signals x' can be measured; moreover, the phase-frequency characteristic of the power converter 11' represented by the phase angle difference depending upon the frequency change of the stable output signals y' and the control signals x' can also be obtained.

For a complex-structure power converter which is hard to be carried out the small-signal model analysis thereof, the aforesaid frequency response analyzer is very useful for testing the frequency response characteristic of the complex-structure power converter. However, when output power of the power system reaches to MW level, the disturbance signal injected into the power system by the frequency response analyzer would be ignored opposite to the MW-level output power, such that the frequency response analyzer cannot accomplish the frequency response characteristic test of the power converter in the power system.

Moreover, if there are multiple power converters paralleled in the power system, the characteristic of the power system may have some variation because the single stable power converter does not be stable anymore after being paralleled with other power converters. In addition, the stable-working power system may become unstable after a new load (or electrical grid) differing from the originally-connected (or electrical grid) load is connected to the power system; meanwhile, the frequency response analyzer is used again for testing the frequency response characteristic of the power converter in the power system. However, the use of the frequency response analyzer becomes more and more inconvenient due to the limitations of the disposing space of the power system and other resources.

Accordingly, in view of the conventionally used frequency response characteristic testing and adjusting way still including drawbacks and shortcomings, the inventor of the present application has made great efforts to make inventive research thereon and eventually provided a switch power converter and a frequency response characteristic testing and adjusting method for the same.

SUMMARY OF THE INVENTION

In accordance with a first aspect of the present invention, a switch power converter is provided. The switch power converter comprises a switch power unit, a controller, a detector and a testing and adjusting unit. The switch power unit has at least a power switch. The controller generates a control signal for the power switch. The detector detects an output voltage signal and/or an output current signal of the switch power unit and outputs a sampling signal. The testing and adjusting unit couples to the detector to test open-loop transfer function of the switch power converter. The testing and adjusting unit comprises a compensator. An AC disturbing signal various in frequency causes the difference in the sampling signal and the testing signal so as to test open-loop transfer function of the switch power converter. The compensator compensates frequency response characteristic of the switch power converter, when the frequency response characteristic the switch power converter doesn't match a target frequency response characteristic.

Because the switch power converter further comprises a frequency response characteristic testing and adjusting unit, the switch power converter is able to measure the frequency response characteristic data by itself; then, the frequency response characteristic of the switch power converter can subsequently be compensated. The above-mentioned testing and adjusting processes are completed in the switch power converter without using any additional frequency response analyzing equipment. In accordance with a second aspect of the present invention, a method of testing and adjusting a switch power converter is provided. The method comprises step (a): providing a digital generator for generating the AC disturbing signal to test open-loop transfer function of the switch power converter; step (b): providing a compensator for attending the test of the open-loop transfer function of the switch power converter; step (c): adjusting the compensator for adjusting frequency response characteristic of the switch power converter through the compensator.

Other features of the present invention will become apparent from consideration of the following description taken in conjunction with the accompanying drawings.

BRIEF DESCRIPTION OF THE DRAWINGS

The novel features of the invention are set forth in the appended claims. However, for purposes of explanation, several embodiments of the invention are set forth in the following figures.

DETAILED DESCRIPTION OF THE PREFERRED EMBODIMENTS

Figure 1:
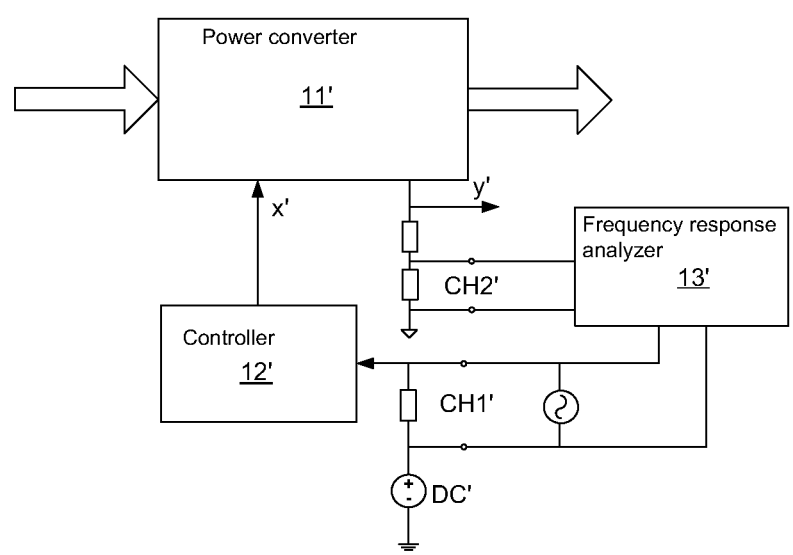
FIG. 1 illustrates a prior art framework diagram of a switch power converter.
Figure 2:
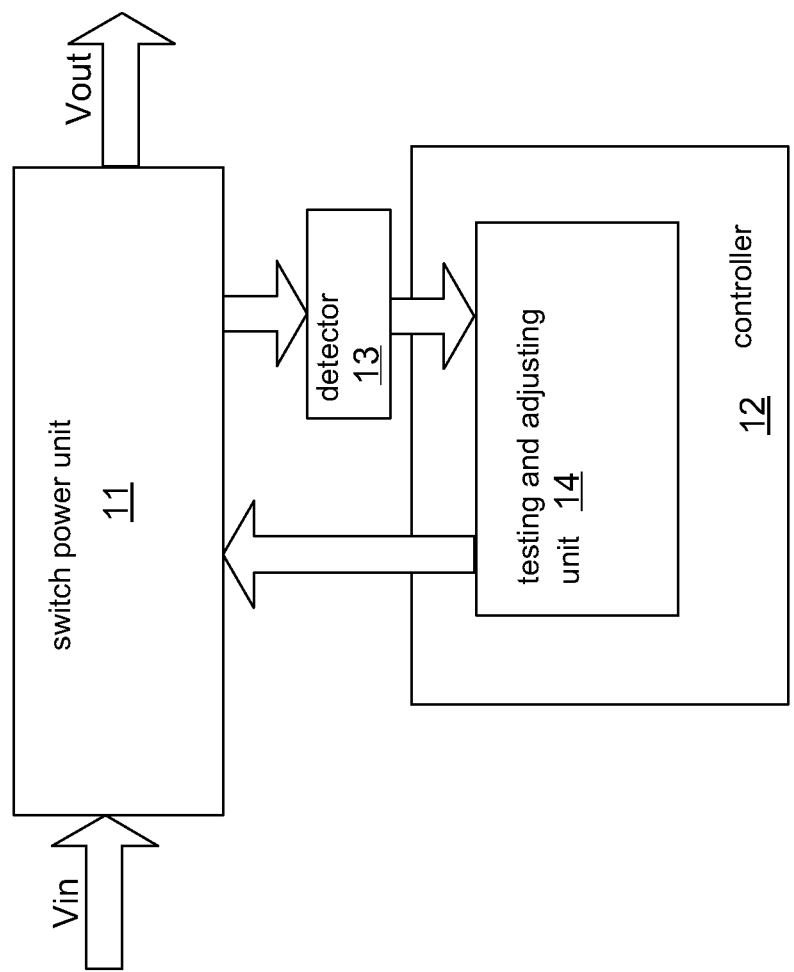
FIG. 2 illustrates a framework diagram of a switch power converter in accordance with an embodiment of the invention.

To more clearly describe a switch power converter and a frequency response characteristic testing and adjusting method for the switch power converter according to the present invention, embodiments of the present invention will be described in detail with reference to the attached drawings hereinafter. Please refer to FIG. 2, which illustrate a framework diagram of a switch power converter in one embodiment. As shown in FIG. 2, the switch power converter in this embodiment comprises: a switch power unit 11 and a controller 12. The switch power unit 11 comprises at least a power switch. The controller 12 generates a control signal for the power switch. The switch power converter further comprises a detector 13 and a testing and adjusting unit 14. The detector 13 detects an output voltage signal and/or an output current signal of the switch power unit 11 and output a sampling signal; the testing and adjusting unit 14 receives the sampling signal and outputs a testing signal to the controller. An AC disturbing signal various in frequency causes the difference in the sampling signal and testing signal so as to test open-loop transfer function of the switch power converter. The testing and adjusting unit 14 comprises a compensator. The compensator compensates frequency response characteristic of the switch power converter, when the frequency of the switch power converter doesn't match a target frequency response characteristic.

Figure 3:
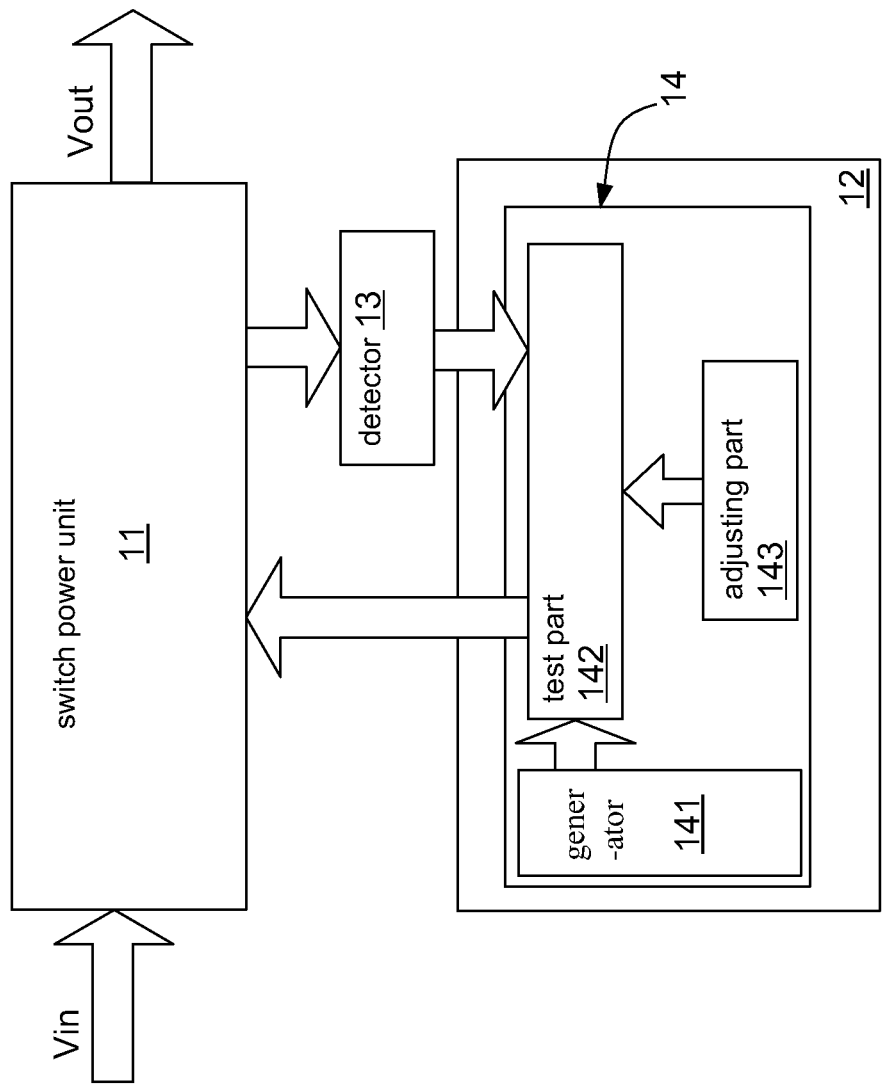
FIG. 3 illustrates a functional block diagram of a testing and adjusting unit in the switch power converter in accordance with an embodiment of the invention.

In one embodiment, the AC disturbing signal is from a digital module embedded in the controller. The digital module is a kind of generator for generating the AC disturbing signal. The user could set the AC disturbing signal in amplitude, frequency, or change mode in a period through the digital module for different kind of switch power converter. In another embodiment, the generator can merge with the testing and adjusting unit. Please refer to FIG. 3, the testing and adjusting unit 14 comprises a generator 141, a test part 142 and adjusting part 143. The generator 141 generates the AC disturbing signal; the test part 142 receives the AC disturbing signal and the sampling signal so as to measure open-loop transfer function of the switch power converter. The adjusting part adjusts the compensator to compensate the switch power converter when the frequency response characteristic of the switch power converter doesn't match the target frequency response characteristic based on data tested by the test part.

Figure 6:
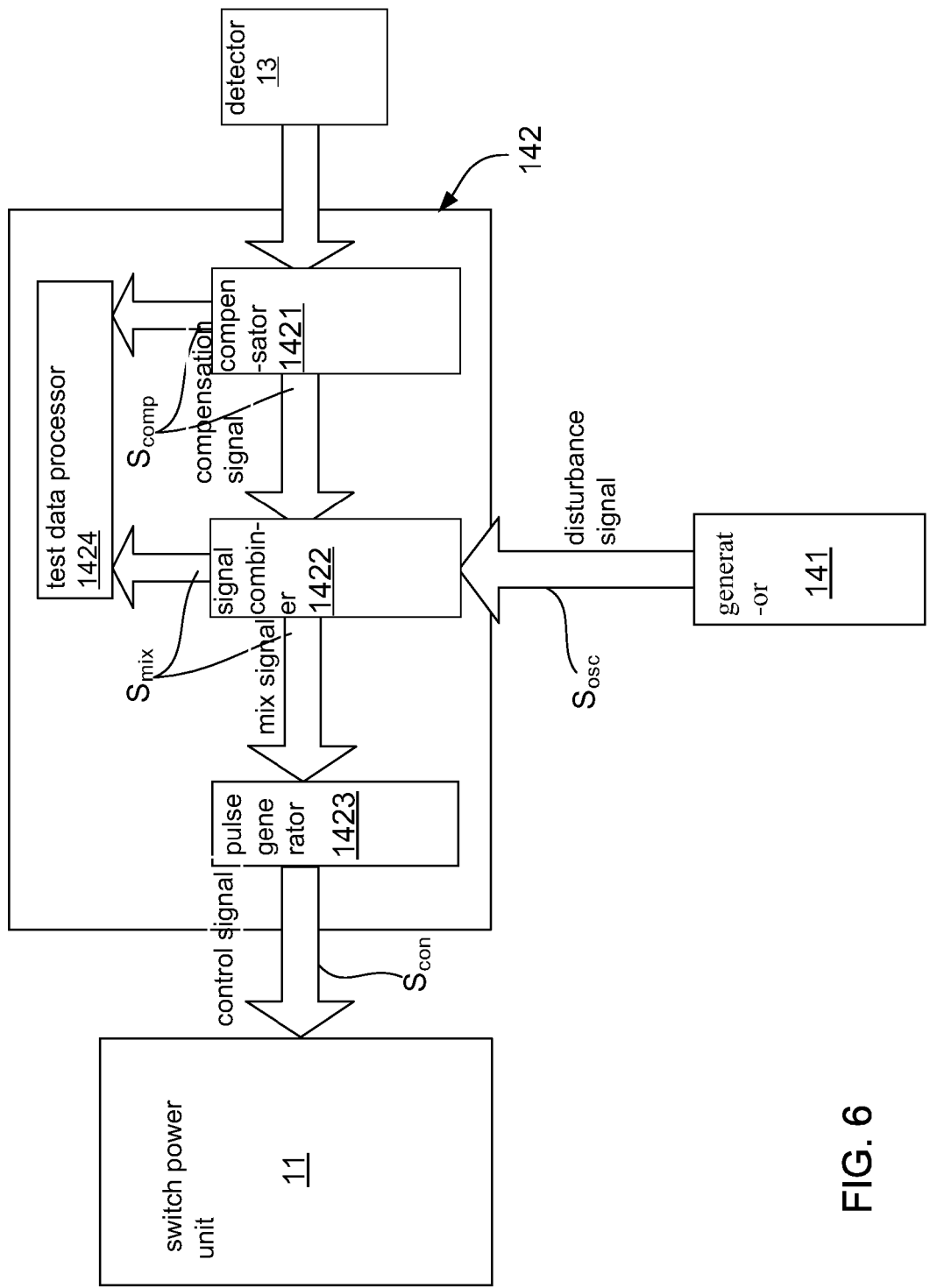
FIG. 6 illustrates a functional block diagram of a test part in the switch power converter in accordance with an embodiment of the invention.

In another embodiment, please refer to FIG. 6, the test part 142 comprises a test data processor 1424, compensator 1421 and signal combiner 1422. In FIG. 6, the compensator 1421 receives the sampling signal from the detector 13 and outputs a compensation signal $S_{comp}$. The signal combiner 1422 does the mathematical treatment with the two signals which are the compensation signal $S_{comp}$ and the AC disturbing signal $S_{osc}$ and outputs a mix signal $S_{mix}$ to the controller. In this embodiment, the controller has a pulse generator 1423 which generates the control signal for the power switch in the switch power unit. And the test part 142 is embedded in the controller. The test data processor 1424 collects the mix signal $S_{mix}$ and the compensation signal $S_{comp}$ to calculate the open-loop transfer function of the switch power converter. In order to help the test data processor 1424 collect the sufficient data, the AC disturbing signal need to change its frequency with time. Then the test data processor 1424 could collect serial data of the mix signal and the compensation signal $S_{comp}$ corresponding to the AC disturbing signals with different frequency. Meanwhile, the generator 141 could be designed to generate AC disturbing signal whose frequency changes with time. In this embodiment, the open-loop transfer function of the switch power converter can be expressed by the following equation (1):

$$D_{comp}/D_{MIX} = G_{plant} * G_{comp} * G_{pulse} \tag{1}$$

The test data processor 1424 collects the data about the signals of $S_{comp}$ and $S_{mix}$ corresponding to each frequency of the AC disturbing signal and makes Fourier Transform with the data collected to get the data about the amplitude or phase of fundamental wave component $D_{comp}$ and $D_{MIX}$. $G_{comp}$ represents transfer function of the compensator, $G_{pulse}$ represents transfer function of the pulse generator 1423, $G_{plant}$ represents transfer function of the switch power unit 11.

Figure 7A:
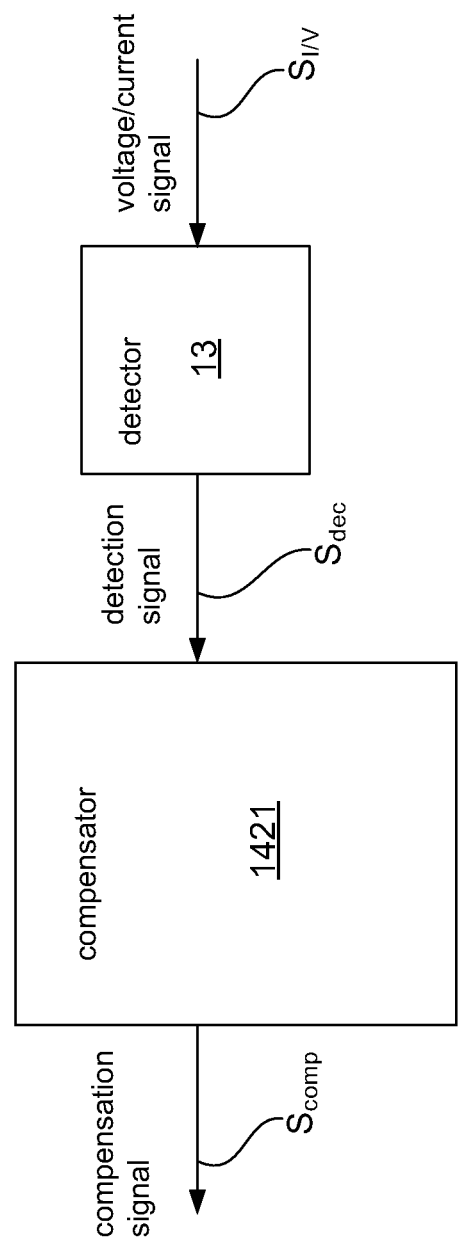
FIGS. 7A and 7B illustrate two different functional block diagrams of a compensator in the test part of the switch power converter in accordance with two embodiments of the invention respectively.
Figure 7B:
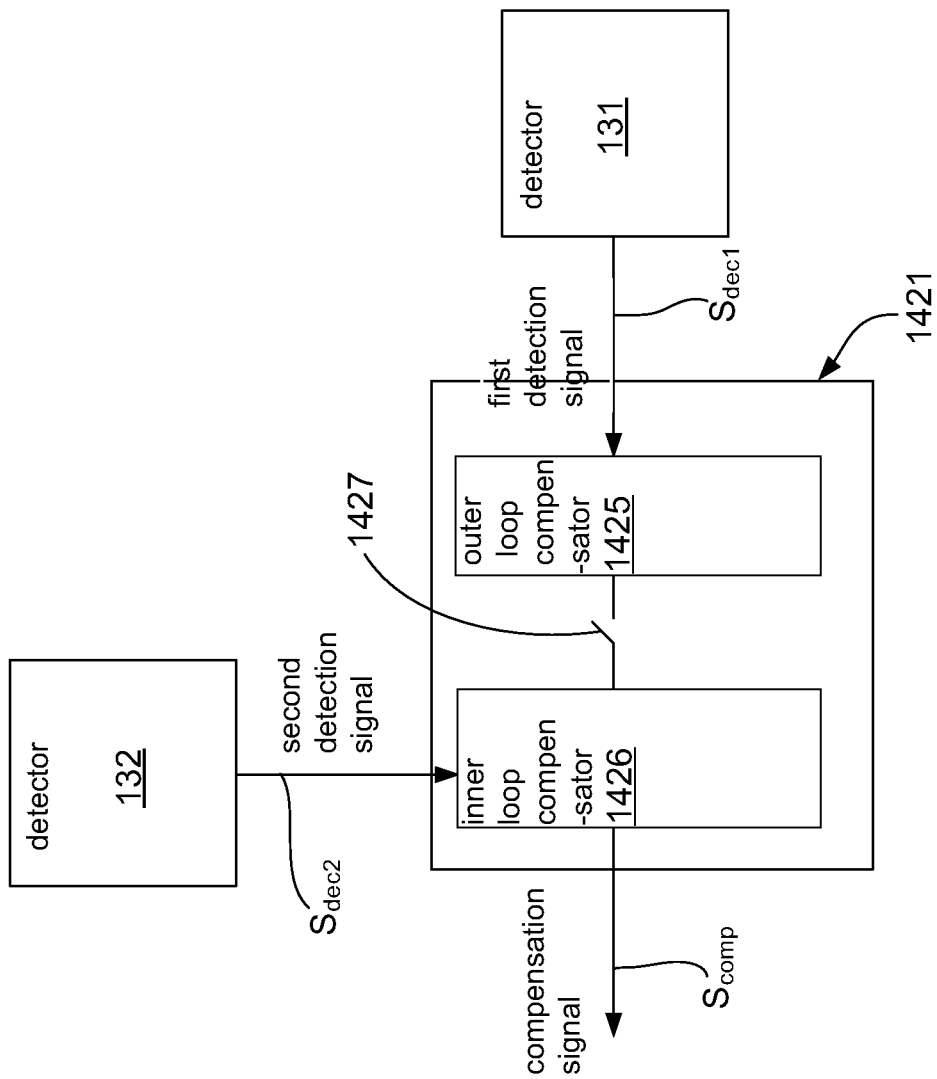

In yet another embodiment, the switch power converter is a kind of single closed-loop system. For this kind of switch power converter, the detector consists of one detection unit. The detection unit could detect the voltage or current signal of the switch power converter. For this kind of switch power converter, the test part has only one compensator corresponding to the single closed-loop system. In some embodiments, the switch power converter is a kind of dual closed-loop system. For this kind of switch power converter, the detector includes at least two detection units for the dual closed-loop system. Usually, the dual closed-loop system has an inner-loop closed system and an outer-loop closed system. Accordingly, the test part includes at least two compensators. Please refer to 7B, the two compensators is an inner-loop compensator 1426 and an outer-loop compensator 1425 corresponding to the inner-loop closed system and outer-loop closed system respectively. In FIG. 7B, there is a selector 1427 which connects the inner-loop compensator 1426 with the outer-loop compensator 1425. The selector 1427 is chosen to connect the outer-loop compensator 1424 with the inner-loop compensator 1425 when the switch power converter is kind of dual closed-loop system. But in the dual closed-loop system, the inner-loop compensator 1426 is not just a simple compensator as the outer-loop compensator 1425, the inner-loop compensator acts as transfer function of the inner-loop closed system. When the switch power converter is kind of single closed-loop system, the transfer function of inner-loop compensator 1426 equals one. For the two different kinds of switch power converter, the open-loop transfer function of the switch power converter can be expressed by the following equation (2):

$$D_{comp}/D_{MIX} = G_{plant} * G_{comp1} * G_{in\_CL} \qquad (2)$$

Wherein, $D_{comp}$ represents fundamental wave component of the compensation signal $S_{comp}$, $D_{mix}$ represents fundamental wave component of the mix signal $S_{mix}$ which combines the AC the disturbing signal and the compensation signal, $G_{comp1}$ represents transfer function of outer loop compensator, $G_{in\_CL}$ represents closed transfer function of the inner loop compensator. $G_{plant}$ represents the same meanings illustrated in equation (1). If the switch power converter is a kind of dual closed-loop control system, the transfer function of inner-loop compensator equals to the inner closed loop transfer function. If the switch power converter is a kind of single closed-loop control system, the transfer function of inner-loop compensator equals to one.

Figure 8:
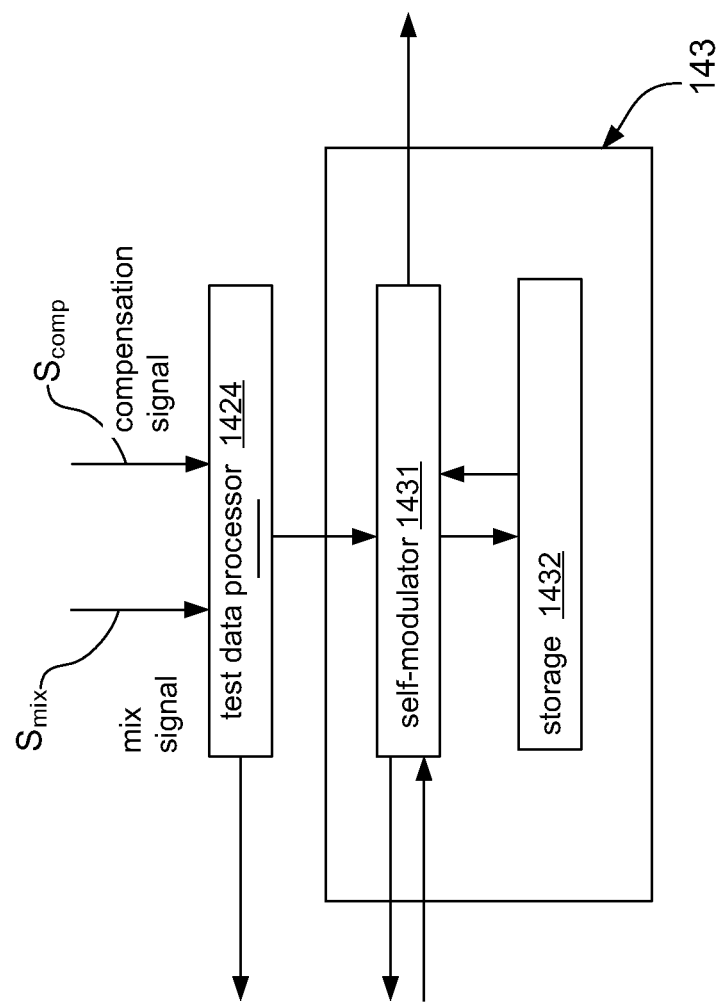
FIG. 8 illustrates a functional block diagram of a adjusting part in the switch power converter in accordance with an embodiment of the invention.
Figure 10:
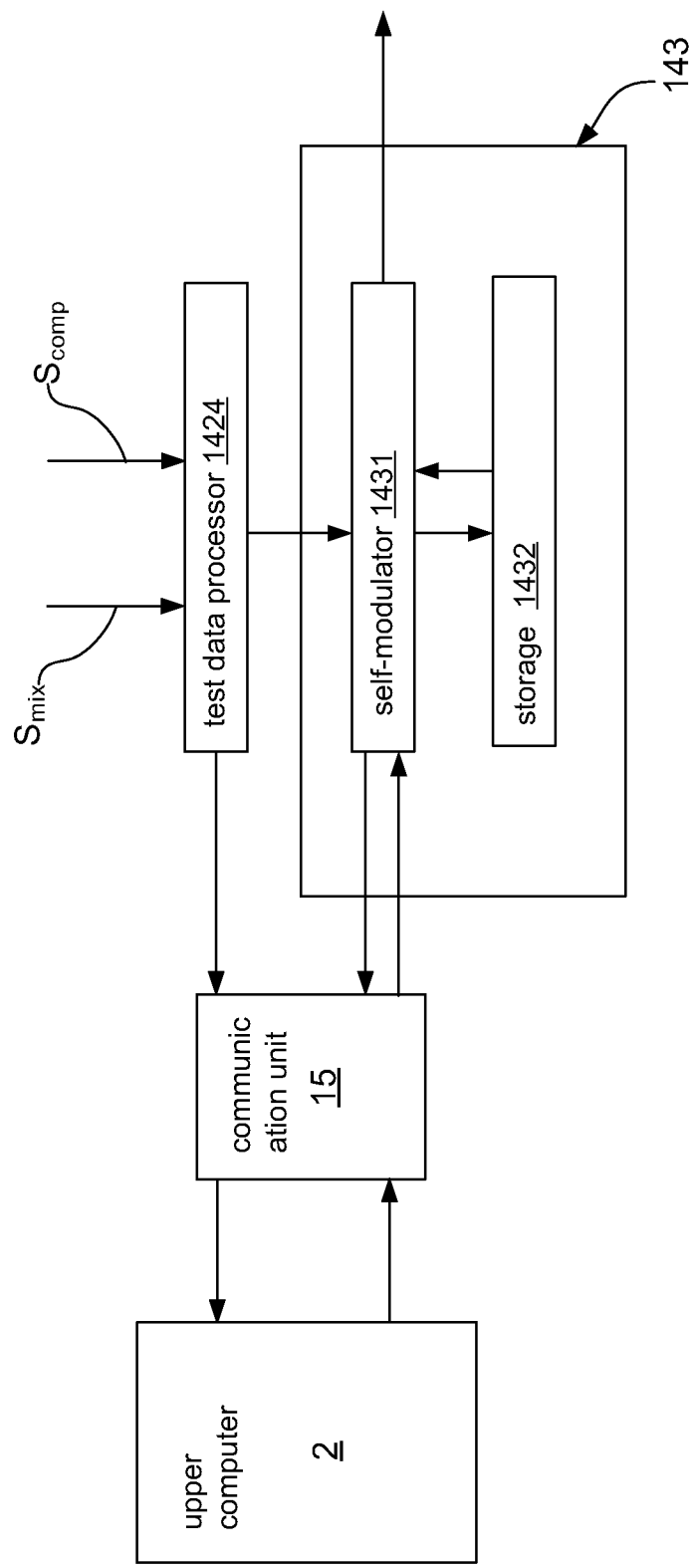
FIG. 10 illustrates functional block diagram of a adjusting part in a switch power converter in accordance with an embodiment of the invention.

Yet another embodiment, please refer to FIG. 8 and FIG. 10, the adjusting part 143 comprises a self-modulator 1431 and a storage 1432. The storage 1432 saves data the testing part tested and the self-modulator 1431 adjusts the compensator according to the data in the storage 1432. Moreover, the storage 1432 saves an experience database about rule the user complied with when the user adjusts the frequency response characteristic in manual operation and target frequency response characteristic of the switch power converter as well. The frequency response characteristic of the switch power converter could refer to target cutoff frequency, target phase margin or target amplitude margin.

Figure 4:
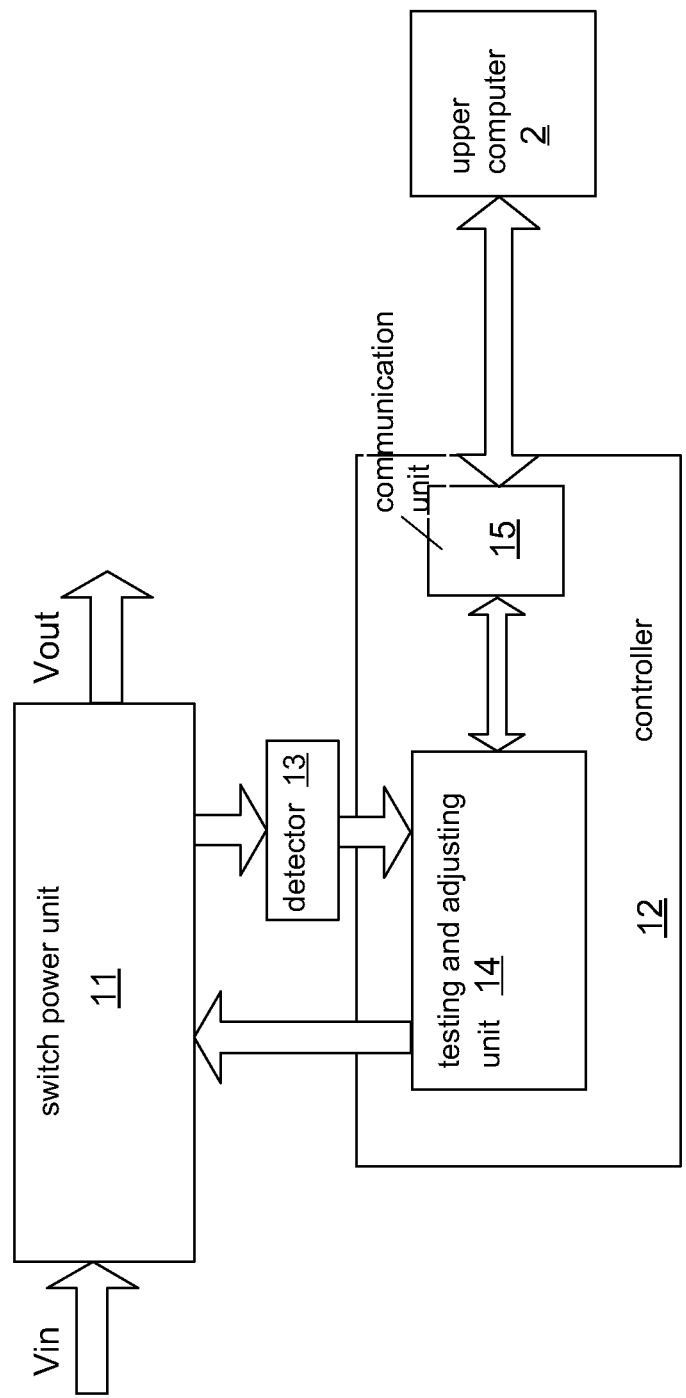
FIG. 4 illustrates a framework diagram of a switch power converter in accordance with an embodiment of the invention.
Figure 5:
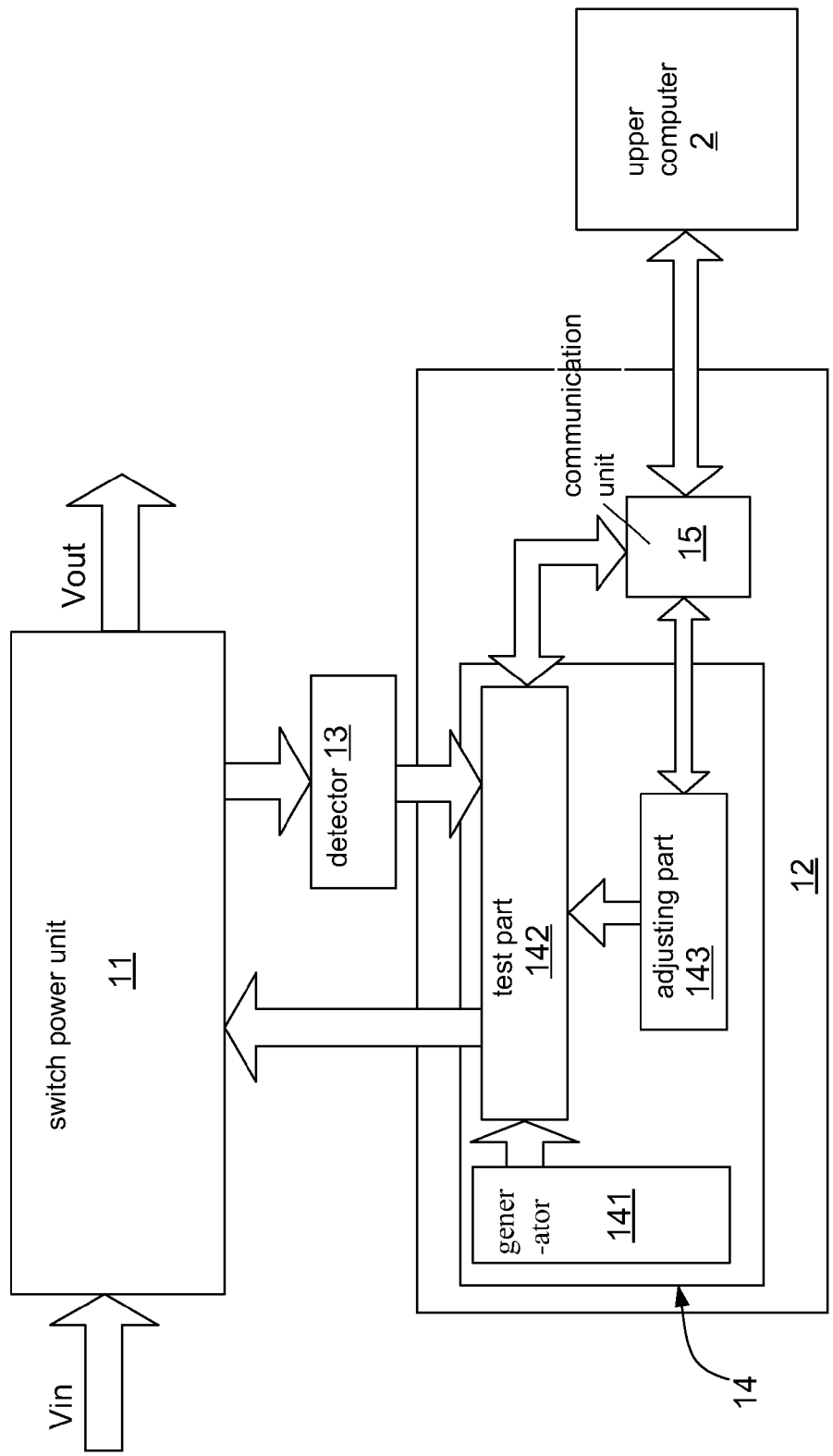
FIG. 5 illustrates a framework diagram of a switch power converter in accordance with an embodiment of the invention.

In a further embodiment, please refer to FIG. 4, FIG. 5 and FIG. 10, the controller 12 further comprises a communication unit 15. The communication unit 15 could communicate with the testing and adjusting unit 14 for information interchange. In this embodiment, as shown in FIG. 4, for facilitating engineers able to access the information stored in the controller 12 and control the controller 12, an upper computer 2 is coupled to the communication unit 15, so as to communicate with the testing and adjusting unit 14 through the communication unit 15. In details, please refer to FIG. 5, the testing and adjusting unit 14 comprises a generator 141, a test part 142 and adjusting part 143. The function of the generator 141, test part 142 or adjusting part 143 have been illustrated in other embodiments, further more illustration about them is omitted herein. In the embodiment, engineers can not only control the test part 142 to measure the open-loop frequency characteristic data of the switch power converter by operating the upper computer 2, but also can control the adjusting part 143 to adjust and/or compensate the frequency-corresponded parameters of the switch power converter according to the measured open-loop frequency characteristic data. In one more specific embodiment, please refer to FIG. 10. In FIG. 10, the test part comprises a test data processor 1424; the adjusting part 143 comprises a self-modulator 1431 and storage 1432. The communication unit could read data from the test data processor 1424 and self-modulator 1431; the self-modulator 1431 also could read or accept the data from the communication unit 15. The self-modulation 1431 and storage 1432 could operate in mutual communication, so do upper computer 2 and communication unit 15.

Figure 9A:
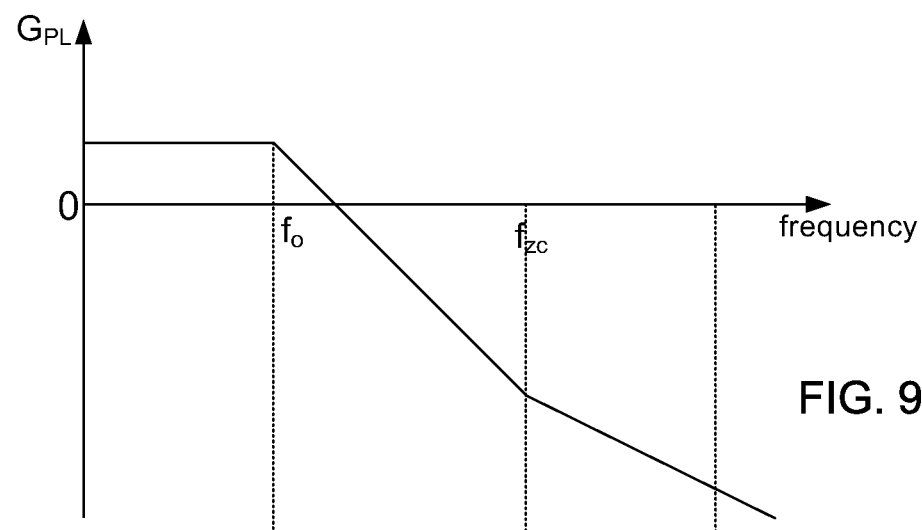
FIG. 9A illustrates a plot of transfer function of a switch power unit of a buck converter in accordance with an embodiment of the invention.

Hereafter, a demonstration of specific switch power converter with combination of some of embodiments above is given for better understanding the present invention. The aforesaid switch power converter is a buck converter, for example. The buck converter is kind of single closed-loop control system and provided with a testing and adjusting unit 14. The testing and adjusting unit 14 is embedded in a controller of the buck converter. There is also an upper computer connected with the testing and adjusting unit. The testing and adjusting unit saves the way to adjusting the compensator and default value of the compensator. The testing and adjusting unit can test the transfer function $G_{PL}$ of the buck converter according to different frequency of the AC disturbing signal, please refer to FIG. 9A. The transfer function $G_{PL}$ of the buck converter could be displayed by the upper computer. The way to adjust the compensator could be expressed by the equation (3):

$$G_{comp} = K \frac{(1 + s/2\pi f_{z1})(1 + s/2\pi f_{z2})}{s(1 + s/2\pi f_{p1})(1 + s/21\pi_{p2})} \qquad (3)$$

Figure 9B:
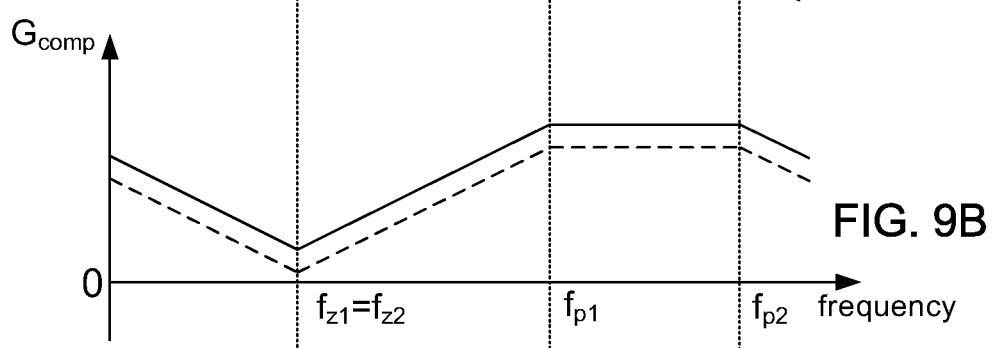
FIG. 9B illustrates a plot of transfer function of a compensator in a buck converter in accordance with an embodiment of the invention.
Figure 9C:
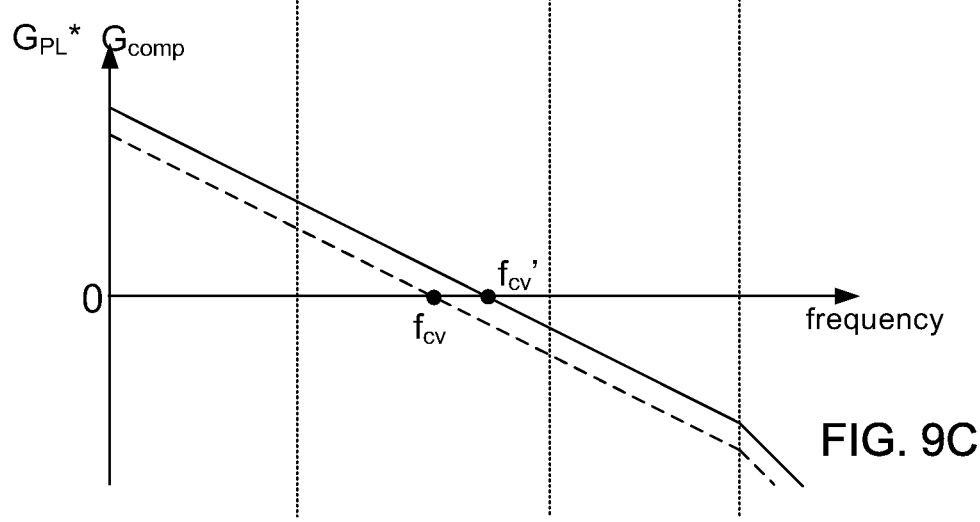
FIG. 9C illustrates a plot of open-loop transfer function of a buck converter in accordance with an embodiment of the invention.

The equation (3) only illustrated one example for the compensator, which has two zero and pole points respectively. Then the transfer function of $G_{comp}$ could be depicted by FIG. 9B. In the above-presented equation (3), K means gain of the compensator, and $f_{z1}$, $f_{z2}$, $f_{p1}$, and $f_{p2}$ represent two zero points and two pole pints of the compensator. As is seen from the FIG. 9B there are two curves plotted. One is plotted with a solid line and the other one is plotted with a dash or broken line. The solid line curve represents the transfer function of the compensator without adjustment. Subsequently, the testing and adjusting unit 14 would firstly define that $f_{z1}=f_{z2}=f_0$, $f_{p1}=f_{zc}$, and $f_{p2}=(5\sim10)f_{CV}$, wherein $f_{CV}$ is the target cut-off frequency, $f_{zc}$ is the zero point of transfer function of the buck converter. Then the dash or broken line curve in FIG. 9B represents the transfer function of compensator after adjustment from the testing and adjusting unit 14. Then, please refer to FIG. 9C, it could get two different results of the transfer function $G_{comp}*G_{PL}$ according to two different transfer function $G_{comp}$ in FIG. 9B. The solid line curve in FIG. 9C represents the transfer function $G_{comp}*G_{PL}$ without compensation from the compensator, the dash line curve represents the transfer function $G_{comp}*G_{PL}$ with compensation from the compensator. The symbol $f_{CV}$ represents cut off frequency of the transfer function $G_{comp}*G_{PL}$ without compensation from the compensator. The symbol $f_{cv}$ represents cut off frequency of the transfer function $G_{comp}*G_{PL}$ with compensation from the compensator.

Therefore, the testing and adjusting unit 14 is able to measure shown in FIG. 9C of the open-loop transfer function of the buck converter and is easy to get frequency response characteristic of the buck converter for the skill in the art. Then it's easy to realize adjusting the frequency response characteristic of the buck converter through the compensator. In the other way to say, the compensator could compensate the frequency response characteristic of the buck converter. The frequency response characteristic of the buck converter refers to cut off frequency, phase margin or the other parameters of the buck converter in frequency response.

Another aspect of present invention introduces a method of testing and adjusting frequency response characteristic of a switch power converter. In one embodiment of the method comprises step (a): providing a digital generator for generating the AC disturbing signal to test open-loop transfer function of the switch power converter; step (b): providing a compensator for attending the test of the open-loop transfer function of the switch power converter; step (c): adjusting the compensator for adjusting frequency response characteristic of the switch power converter through the compensator. In step (a), the digital generator is easy to generating the AC disturbing signal in different frequency without limitation of frequency. In some traditional device, the AC disturbing signal generated by this kind of device has limitation of frequency. In step (b), the transfer function of the compensator is known and it's convenient to put the compensator in the test loop. In step (c), the compensator could be modulated to adjust frequency response characteristic of the switch power converter. Then, it's convenient for the user to test the frequency response characteristic of the switch converter in any time. Even the configuration of the switch power converter has changed in order to meet a new requirement, it's also convenient for the user the test and adjust current switch power converter.

In another embodiment, the digital generator could be embedded in the controller of the switch power converter. In yet another embodiment, the compensator is a digital compensator, the digital compensator could be embedded in the controller of the switch power converter. The compensator also could be a proportion integration modulator or a proportion integration differentiation modulator in other embodiments.

The subsequent content will introduce two different program flows to implement the method which comprises step (a), (b) and (c). The two different program flows shows the details about how to conduct the frequency response characteristic test and modulation of the switch power converter.

Figure 11:
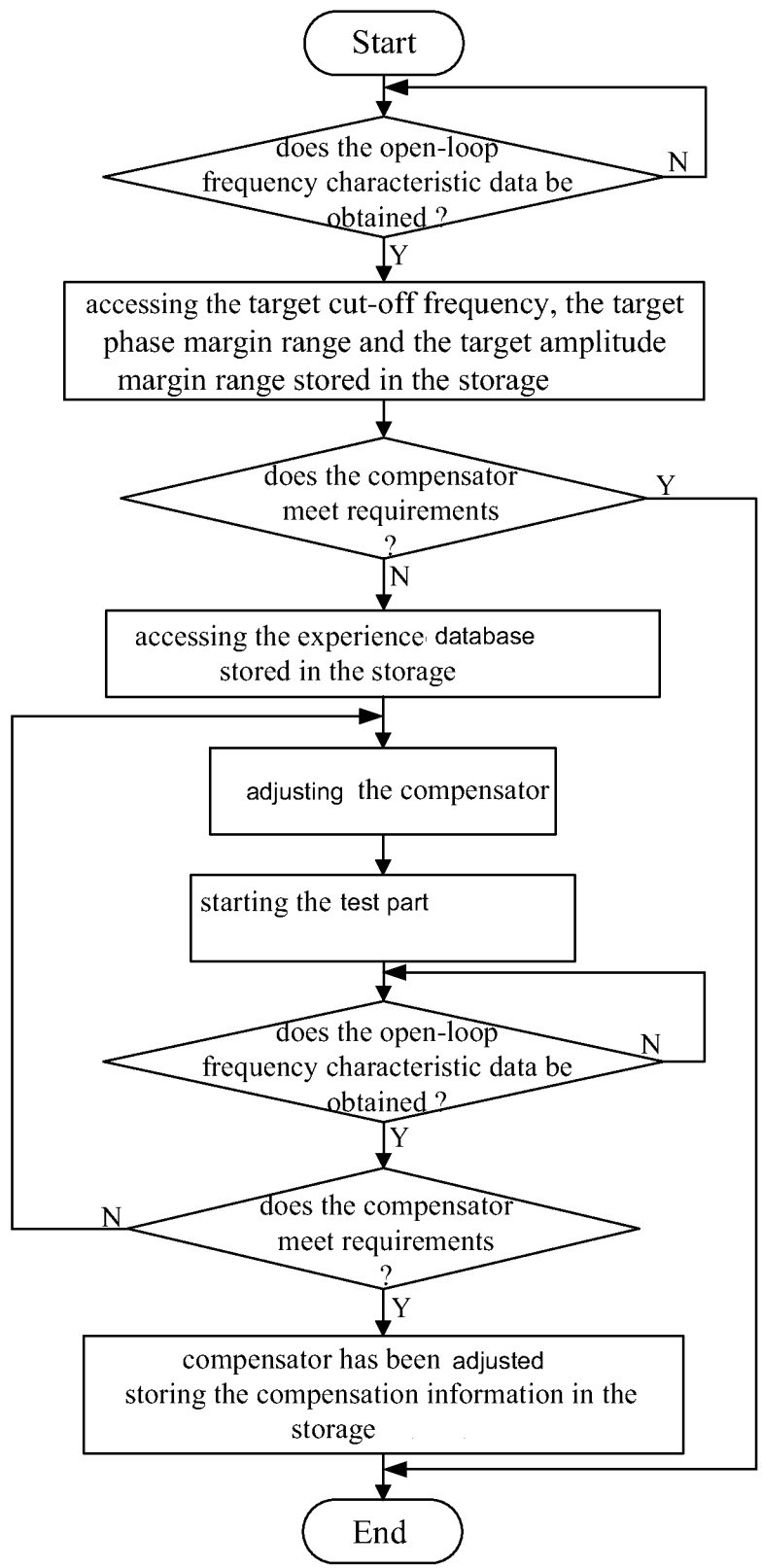
FIGS. 11 and 12 illustrates two process flow diagrams of a method of testing and adjusting frequency response characteristic of a switch power converter in accordance with two embodiments of the invention respectively.

The first program flow, please refer to FIG. 11. Firstly starting the frequency response characteristic testing and adjusting unit in the switch power converter, so as to measure the frequency characteristic data of the switch power converter and then processing the measured frequency characteristic data. If the frequency characteristic data is still under processing, the program would wait for the finish of the data process; when the frequency characteristic data of the switch power converter is finished, accessing the data about the target cut-off frequency, the target phase margin or the target amplitude margin of the switch power converter. Then, comparing the test data about the switch power converter with the target data about the switch power converter to estimate whether the current parameters of the compensator could make the data about the switch power converter meet the target. After the estimate, if current parameters of the compensator could make the data about the switch power converter meet the target, then the self-modulation of the compensator is over, otherwise adjusting the parameters of compensator until the data about the switch power converter meets target. The process about the adjustment of compensator is a little complicate. There is one way to shorten the time spent on adjustment of compensator. An experience database about the way to how to adjust a specific compensator is saved according to comparison result between current data and target of switch power converter. When it is requested to adjust the compensator, then the way to adjust the compensator could refer to the experience database. Every time adjustment of compensator is complete, a new test about switch power converter will begin to verify the test data about the switch power converter. If the new test data of the switch power converter meet the target, the modulation of compensator is over. Then the current setting of the compensator and the last test data about the switch power converter are saved. The process of the program is over.

Figure 12:
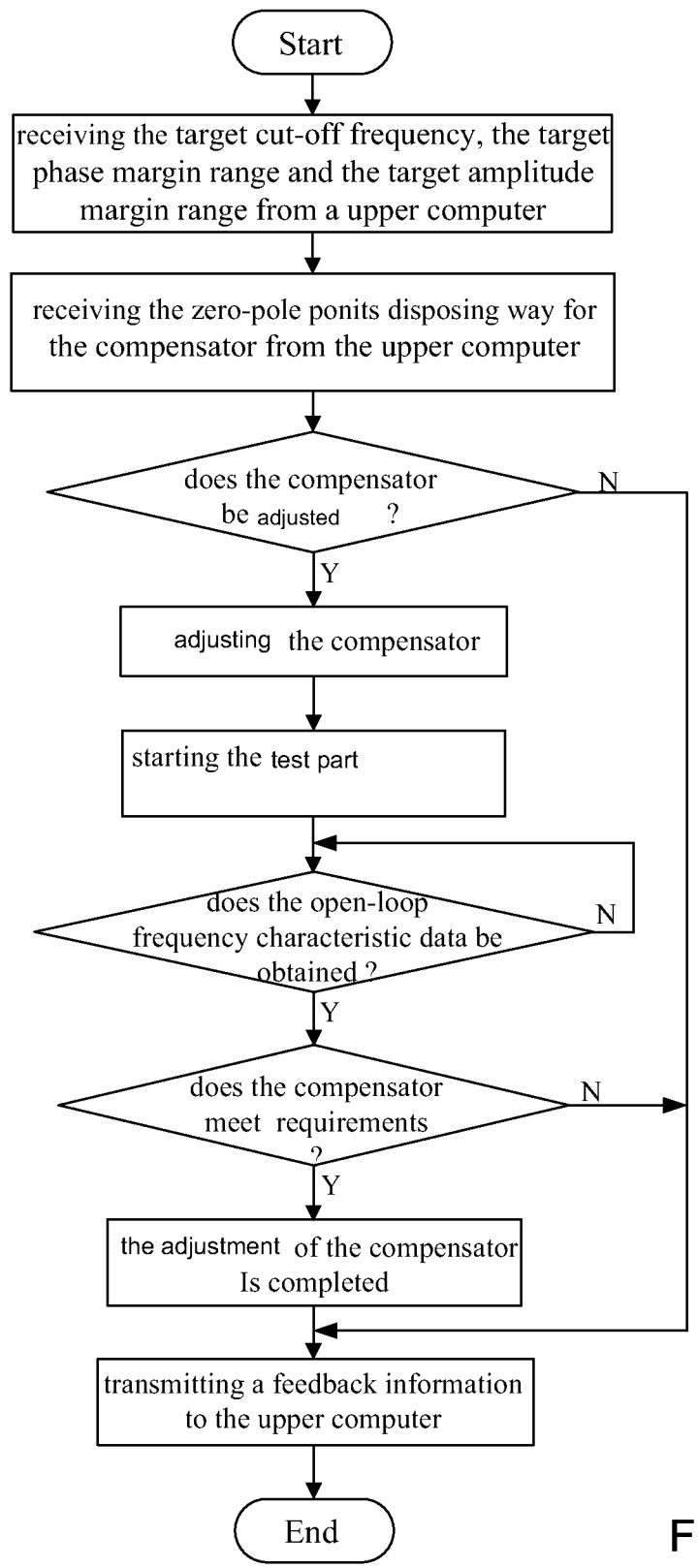

The second program flow, please refer to FIG. 12. The flow chart in FIG. 12 introduces a way to adjust current state of the switch power converter according to the target the user set. Firstly, start the upper computer, the program receives the data about the switch power converter from the upper computer. The data about the switch power converter could refer to the target cut-off frequency, the target phase margin or the target amplitude margin. The program also receives the data about the compensator from the upper computer. The data about compensator includes the method to configure the zero point or pole point of the compensator. Then the program will decide whether the compensator needs to be adjusted. If there is need to adjust the compensator, the program will start the part for adjustment of compensator. In this part, every time the adjustment of compensator is complete, one new test about switch power converter will begin to verify the test data. If the test data about the switch power converter could meet the target, the part for adjustment of compensator is over. Then current data about compensator and the switch power converter will be transmitted to the upper computer. If the data about the switch power converter could meet the target but not the data about the compensator, this information will be transmitted to the upper computer as well.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:
1. A switch power converter comprising:
 a switch power unit comprising at least a power switch;
 a controller configured to generate a control signal for the power switch;
 a detector configured to detect an output voltage signal and/or an output current signal of the switch power unit and output a sampling signal; and
 a testing and adjusting unit configured to receive the sampling signal and output a testing signal to the controller, the testing and adjusting unit comprising:
  a generator for generating an AC disturbing signal;
  a test part for receiving the AC disturbing signal and the sampling signal so as to measure an open-loop transfer function of the switch power converter, the test part comprising:
   a compensator configured for receiving the sampling signal and for outputting a compensation signal; and
   a signal combiner configured for receiving the compensation signal and the AC disturbing signal and for outputting a mix signal to the controller; and
  an adjusting part for adjusting the compensator to compensate the switch power converter when a frequency response characteristic of the switch power converter does not match a target frequency response characteristic based on data tested by the test part, wherein the AC disturbing signal has a frequency that varies with time and causes a difference in the sampling signal and the testing signal so as to test the open-loop transfer function of the switch power converter, and the compensator compensates the frequency response characteristic of the switch power converter when the frequency response characteristic of the switch power converter does not match the target frequency response characteristic.

2. The switch power converter of claim 1, wherein the switch power converter is a kind of single closed-loop control system, and the detector comprises a detection unit for detecting the output voltage signal or the output current signal of the switch power converter.

3. The switch power converter of claim 1, wherein the switch power converter is a kind of dual closed-loop control system, and the detector comprises two detection units for detecting the voltage and/or current signal of the switch power converter.

4. The switch power converter of claim 1, wherein the controller is a digital signal processor (DSP), and the testing and adjusting unit is embedded in the controller.

5. The switch power converter of claim 1, wherein the compensator comprises:

an outer-loop compensator;
a selector; and
an inner-loop compensator connected with the outer-loop compensator through the selector.

6. The switch power converter of claim 1, wherein the testing part further comprises a test data processor, the test data processor obtains the mix signal and the compensation signal corresponding to the mix signal to calculate a gain and phase of the switch power unit for the AC disturbing signal in present frequency so as to get the open-loop transfer function of the switch power converter.

7. The switch power converter of claim 1, wherein the adjusting part comprises a self-modulator and storage, the storage saves data the test part tested and the self-modulator adjusts the compensator according to the data in the storage.

8. The switch power converter of claim 7, wherein the storage further saves an experience database about a way a user adjusts the compensator when the user adjusts the frequency response characteristic in a manual operation.

9. The switch power converter of claim 7, wherein the storage further saves the target frequency response characteristic of the switch power converter.

10. The switch power converter of claim 1, wherein the controller further comprises a communication unit, the communication unit communicates with the testing and adjusting unit for information interchange.

11. A method of testing and adjusting frequency response characteristic of a switch power converter comprising a switch power unit and a controller, the method comprising:

providing a digital generator for generating an AC disturbing signal to test open-loop transfer function of the switch power converter;

providing a detector for detecting an output voltage signal and/or an output current signal of the switch power unit and output a sampling signal;

providing a compensator for receiving the sampling signal from the detector and for attending the test of the open-loop transfer function of the switch power converter; and adjusting the compensator for adjusting frequency response characteristic of the switch power converter through the compensator.

12. The method of claim 11, further comprising:
embedding the digital generator in the controller.

13. The method of claim 11, further comprising:
employing a digital compensator as the compensator and embedding the digital compensator in the controller.

14. The method of claim 11, wherein adjusting the compensator comprises:
adjusting a gain and/or phase of the compensator.

15. The method of claim 11, further comprising:
employing a proportion integration modulator or a proportion integration differentiation modulator as the compensator.

* * * * *